(12) United States Patent
Wong et al.

(10) Patent No.: US 7,279,401 B2
(45) Date of Patent: Oct. 9, 2007

(54) FABRICATING METHOD FOR FLEXIBLE THIN FILM TRANSISTOR ARRAY SUBSTRATE

(75) Inventors: Te-chi Wong, Chiayi County (TW); Jian-Shu Wu, Yunlin County (TW); Horng-Long Tyan, Hsinchu (TW); Chyi-Ming Leu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 122 days.

(21) Appl. No.: 11/306,564

(22) Filed: Jan. 3, 2006

(65) Prior Publication Data

US 2007/0065993 A1    Mar. 22, 2007

(30) Foreign Application Priority Data

Sep. 19, 2005  (TW) .............................. 94132258 A

(51) Int. Cl.
*H01L 21/30* (2006.01)
*H01L 21/46* (2006.01)

(52) U.S. Cl. ................................... 438/458; 257/E21.6
(58) Field of Classification Search ................ 438/455, 438/458, 30

See application file for complete search history.

(56) References Cited

U.S. PATENT DOCUMENTS

| 2003/0032210 A1* | 2/2003 | Takayama et al. ............ 438/30 |
| 2006/0189023 A1* | 8/2006 | Chang et al. .................. 438/69 |
| 2007/0059854 A1* | 3/2007 | Huang et al. .................. 438/30 |

\* cited by examiner

*Primary Examiner*—David W. Coleman
(74) *Attorney, Agent, or Firm*—Jianq Chyun IP Office

(57) ABSTRACT

A method of fabricating a flexible thin film transistor array substrate is provided. First, a rigid substrate is provided, and a polymer material layer is coated on the rigid substrate. Then, an insulating layer is coated over the polymer material layer by a spin coating process. The insulating layer covers the sides of the polymer material layer. Thereafter, a thin film transistor array is formed over the insulating layer. Then, the polymer material layer having the thin film transistor array is separated from the rigid substrate.

13 Claims, 4 Drawing Sheets

FABRICATING METHOD FOR FLEXIBLE THIN FILM TRANSISTOR ARRAY SUBSTRATE

CROSS-REFERENCE TO RELATED APPLICATION

This application claims the priority benefit of Taiwan application serial no. 94132258, filed on Sep. 19, 2005. All disclosure of the Taiwan application is incorporated herein by reference.

BACKGROUND OF THE INVENTION

1. Field of the Invention

The present invention relates to a method of fabricating a thin film transistor array substrate, and more particularly, to a method of fabricating a flexible thin film transistor array substrate.

2. Description of the Related Art

While the flat display is developing towards bigger panel sizes, other features such as lightness, thinness, and flexibility are to be met for flat displays of the next generation. Thus, the flat panel display made of plastic substrate is the new trend in the industry. In the conventional method of fabricating the thin film transistor array substrate of the flexible flat display, first a plastic substrate is adhered to a glass substrate, and then the thin film transistor is fabricated on the plastic substrate. Such method is a sheet-to-sheet fabricating process and meets the general fabricating requirement. However, after the thin film transistor is fabricated, how to separate the plastic substrate from the glass substrate becomes an issue.

In addition, the plastic substrate is hard to control during the fabricating process since it is more flexible. In order to solve this problem, a roll-to-roll method had been proposed for the fabricating process in the conventional technology. However, since the equipment and fabricating process are not mature and the feasibility is not evaluated, it is more practical to use the sheet-to-sheet method to fabricate the flexible flat panel display. Accordingly, how to smoothly and rapidly separate the plastic substrate from the glass substrate had become one of the key techniques.

In addition, since the conventional plastic substrate is vulnerable to acid, alkali or organic solvent, as a result, the subsequent fabricating process is more complicated and the product yield rate can be reduced.

SUMMARY OF THE INVENTION

Therefore, it is an object of the present invention to provide a method of fabricating a flexible thin film transistor array substrate. The method of the present invention is a solution to the problems that the flexible thin film transistor array substrate cannot be easily separated from a glass substrate and that the polymer material is vulnerable to acid, alkali or organic solvent.

The present invention provides a method of fabricating a flexible thin film transistor array substrate. First, a rigid substrate is provided, and a polymer material layer is coated on the rigid substrate. Then, an insulating layer is coated over the polymer material layer by a spin coating process, wherein the insulating layer covers the sides of the polymer material layer. Thereafter, a thin film transistor array is formed over the insulating layer. Finally, the polymer material layer having the thin film transistor array disposed thereon is separated from the rigid substrate.

In an embodiment of the present invention, the polymer material layer is a transparent polymer material, and usually this polymer material is vulnerable to acid, alkali or organic solvent.

In an embodiment of the present invention, the temperature in a baking process of the spin coating process mentioned above is within a glass transformation temperature ($T_g$) range of the polymer material layer. In one embodiment, the temperature of the baking process is lower than 200° C.

In an embodiment of the present invention, the material of the insulating layer mentioned above comprises an inorganic insulating material. The material of the inorganic insulating layer comprises a material such as silicon oxide, silicon nitride, or silicon oxynitride, for example.

In an embodiment of the present invention, the material of the insulating layer mentioned above comprises a water-resistance organic insulating material.

In an embodiment of the present invention, the method for separating the polymer material layer having the thin film transistor array disposed thereon from the rigid substrate comprises: removing an insulating layer disposed on at least one side surfaces of the polymer material layer; and getting an interface between the polymer material layer and the rigid substrate in contact with a release agent. Here, the release agent may be water. In addition, the method for removing the insulating layer disposed on one side of the polymer material layer comprises an incising method.

In an embodiment of the present invention, the thin film transistor array mentioned above comprises a Low Temperature Polycrystalline Thin Film Transistor (LTPS TFT) array.

In an embodiment of the present invention, the rigid substrate mentioned above comprises a glass substrate.

In the method of fabricating a flexible thin film transistor array substrate provided by the present invention, the polymer material layer is covered by an insulating layer formed by the spin coating process, and the adhesive is not used between the polymer material layer and the rigid substrate. Thus, the polymer material layer can be easily separated from the rigid substrate in the subsequent process by simply removing a part of the insulating layer and using some release agent. Accordingly, the method of the present invention can resolve the problem that the flexible thin film transistor array substrate cannot be easily separated from a glass substrate in the prior art. In addition, the problem that polymer material is vulnerable to acid, alkali or organic solvent is also settled.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

FIGS. 1~6 are schematic cross-sectional views illustrating the fabricating method of a flexible thin film transistor array substrate according to a preferred embodiment of the present invention.

DESCRIPTION PREFERRED EMBODIMENTS

Figure 1:
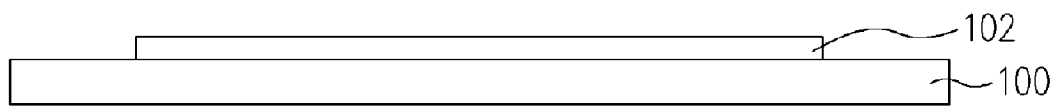

FIGS. 1~6 are schematic cross-sectional views illustrating the fabricating method of a flexible thin film transistor array substrate according to a preferred embodiment of the present invention. Referring to FIG. 1, in the method of fabricating the flexible thin film transistor array substrate provided by the present invention, first a rigid substrate 100 is provided, and the rigid substrate 100 is a glass substrate or a substrate with certain rigidity. Here, the rigidity of the rigid substrate 100 should be high enough to maintain its original shape even when it is being moved or transported. Preferably, the weight of the rigid substrate 100 is within a range tolerable by the robot hand, and the thickness of the rigid substrate 100 is within 1 mm. In addition, the rigid substrate 100 preferably has better resistance to strong acid, strong alkali and solvent, and does not deform under the high baking temperature. Then, a polymer material layer 102 is coated on the rigid substrate 100. Here, the polymer material layer 102 is made of a material such as transparent polyimide or other transparent plastic material, and usually it is made of a material vulnerable to organic solvent. In addition, the polymer material layer 102 can be coated on the rigid substrate 100 by any known coating method, such as the Doctor blade coating process or the spin coating process.

Figure 2:
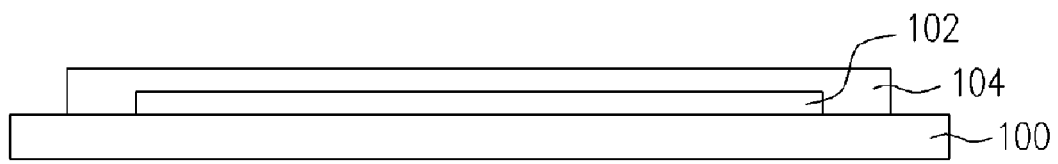
Figure 7:
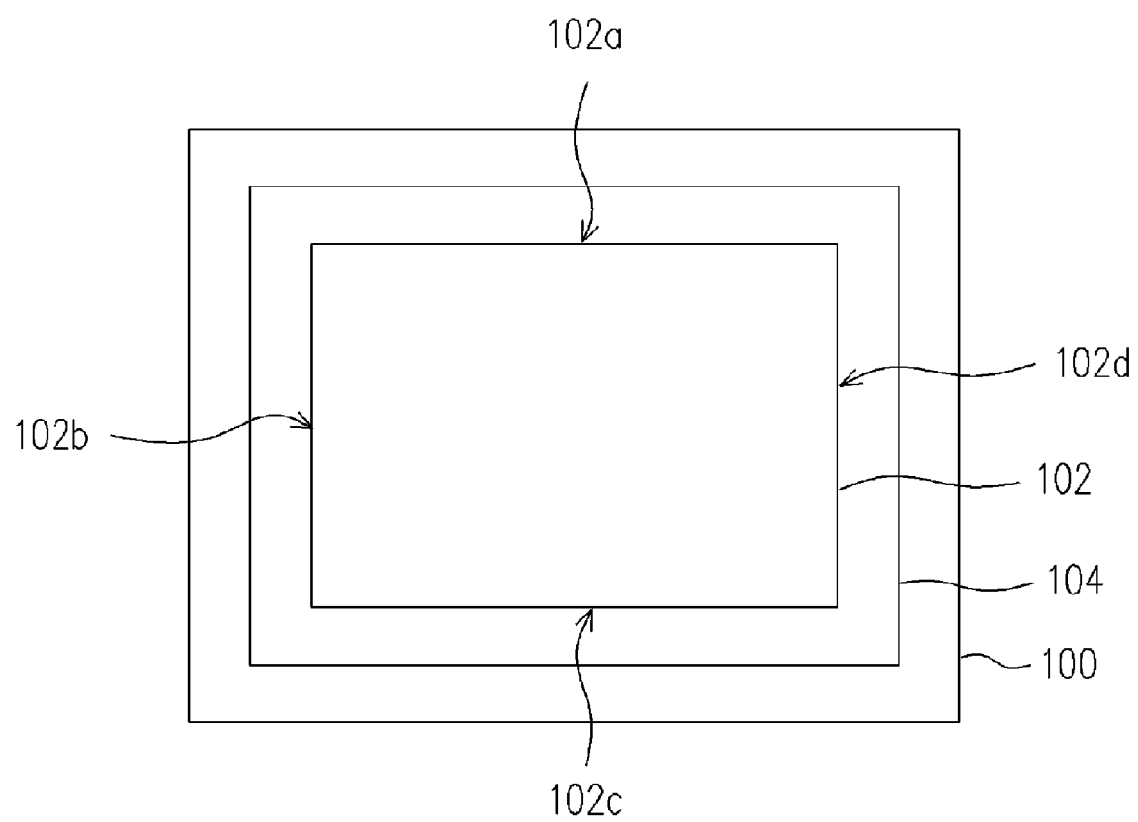
FIG. 7 is a schematic top view of FIG. 3.

Then, referring to FIG. 2, an insulating layer 104 is coated on the polymer material layer 102 by the spin coating process, and the insulating layer 104 covers the sides of the polymer material layers 104. In an embodiment of the present invention, the top view of the structure after the insulating layer 104 coated on the polymer material layer 102 is shown in FIG. 7. The polymer material layer 102 disposed on the rigid substrate 100 has four side surfaces 102a, 102b, 102c, and 102d, and the insulating layer 104 coated on the polymer material layer 102 does not only cover the top surface of the polymer material layer 102, but also the side surfaces 102a, 102b, 102c, and 102d of the polymer material layer 102. The present invention does not limit the shape and the number of the sides of the polymer material layer 102, and different shape or number of the sides can be used in the present invention according to the physical requirement of the product design. Here, the side surfaces 102a, 102b, 102c, and 102d of the polymer material layer 102 are all covered by the insulating layer 104 coated on the polymer material layer 102. Accordingly, with the insulating layer 104, the polymer material layer 102 will not be eroded by water or other organic solvent in subsequent fabricating process.

In addition, the insulating layer 104 may be made of an inorganic insulating material or an organic insulating material. If the insulating layer 104 is an inorganic insulating layer, it may be made of a material such as silicon oxide, silicon nitride, or silicon oxynitride. If the insulating layer 104 is made of the organic insulating material, it is preferably made of an organic insulating material having good water-resistance capability. Moreover, the spin coating process for forming the insulating layer 104 on the polymer material layer 102 comprises: first performing a coating process on a liquid insulating layer material; then performing a baking process in order to remove the solvent inside the liquid insulating layer material, such that the liquid insulating layer material solidifies and forms a layer of insulating solid film. Here, the baking temperature is preferably set within a glass transformation temperature ($T_g$) range of the polymer material layer. In an embodiment of the present invention, the baking temperature is lower than 200° C. In other words, the baking temperature varies depending on the type of the polymer material layer 102. Accordingly, if the polymer material layer 102 is made of polyimide, the baking temperature is about 180° C.

Figure 3:
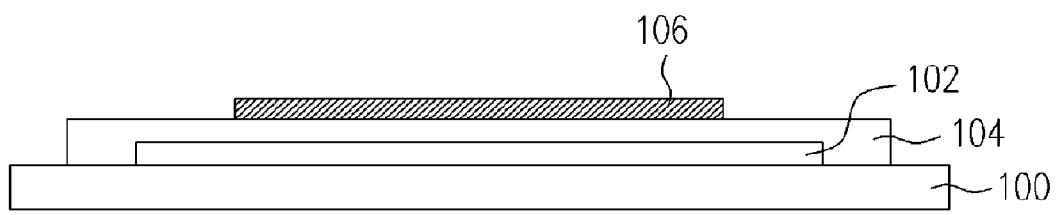
Figure 8:
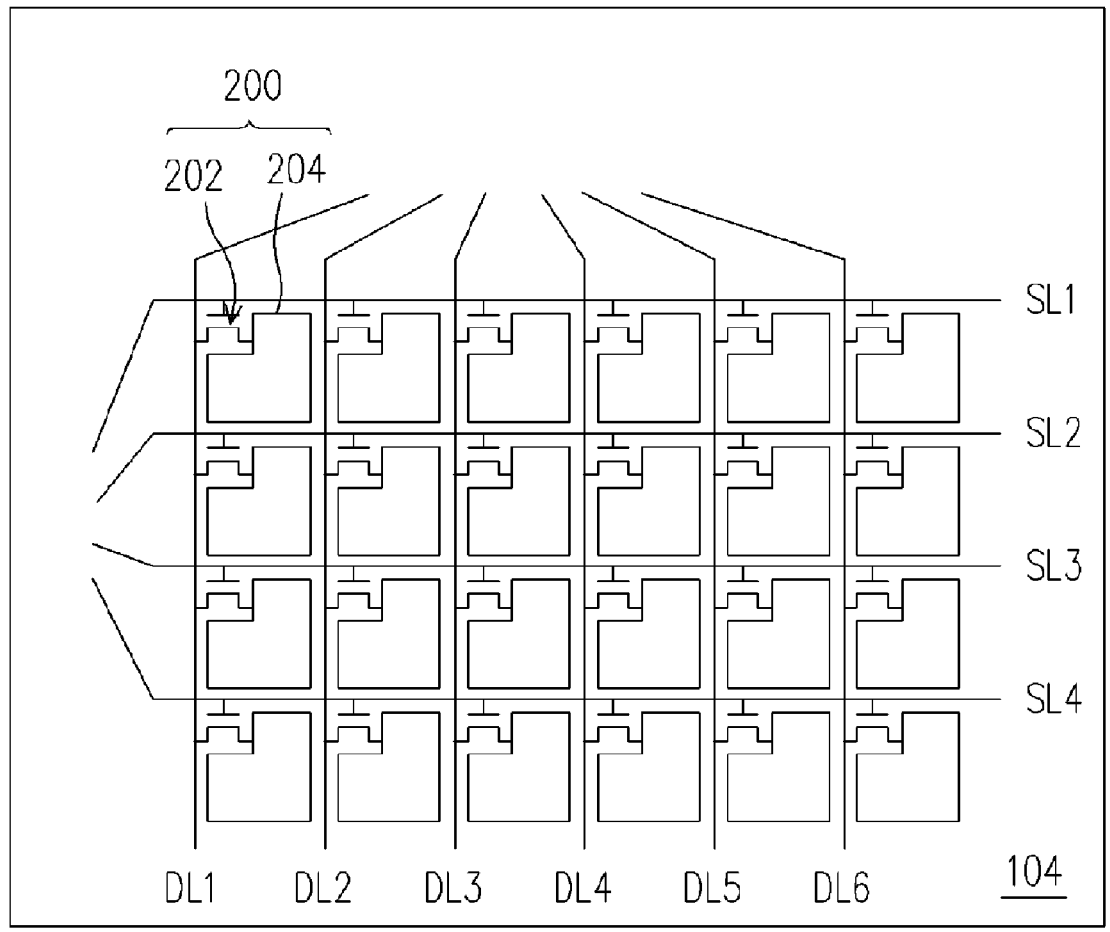
FIG. 8 is a schematic diagram of the thin film transistor array in FIG. 3.

Then, referring to FIG. 3, a thin film transistor array 106 is formed on the insulating layer 104, wherein the thin film transistor array 106 may be a Low Temperature Polycrystalline Thin Film Transistor (LTPS TFT) array. In an embodiment of the present invention, the top view of the structure after the thin film transistor array 106 is formed on the insulating layer 104 shown in FIG. 8 comprises a plurality of scanning lines SL1~SL4, a plurality of data lines DL1~DL6, and a plurality of pixel units 200. Each of the pixel units 200 is electrically connected to one of the scanning lines SL1~SL4 and one of the data lines DL1~DL6, and each of the pixel units 200 comprises a thin film transistor 202 and a pixel electrode 204. In addition, the scanning lines SL1~SL4 and the data lines DL1~DL6 extend to the periphery of the whole structure and are electrically connected to a driving circuit (not shown).

It is to be noted that if the thin film transistor 106 is a LTPS TFT array, a laser anneal process is commonly included in the general LTPS TFT fabricating process in order to convert an amorphous silicon (a-Si) layer into a polysilicon layer. In the present invention, since the LTPS TFT array 106 is formed on the insulating layer 104 rather than directly formed on the polymer material layer 102, after the a-Si layer is formed on the insulating layer 104, when the laser anneal process is performed on the a-Si layer, the insulating layer 104 will have better heat insulation capability, such that the high temperature generated in the laser anneal process does not negatively affect the polymer material layer 102. In general, the insulating layer 104 formed by the spin coating process can endure the high temperature of 500 to 600° C.

In addition, if the thin film transistor array 106 is subsequently applied in the Liquid Crystal Display (LCD), after forming the thin film transistor array 106, the method may further comprise a step of forming a planarizing layer and an alignment film on the thin film transistor array 106. Alternatively, if the thin film transistor array 106 is further applied in the Organic Electroluminescent Flat-Panel, after forming the thin film transistor array 106, the method may further comprise a step of forming an organic emitting layer and an electrode layer on the thin film transistor array 106.

Figure 4:
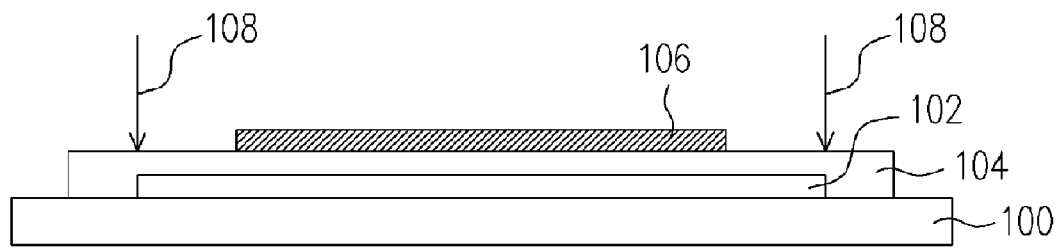
Figure 5:
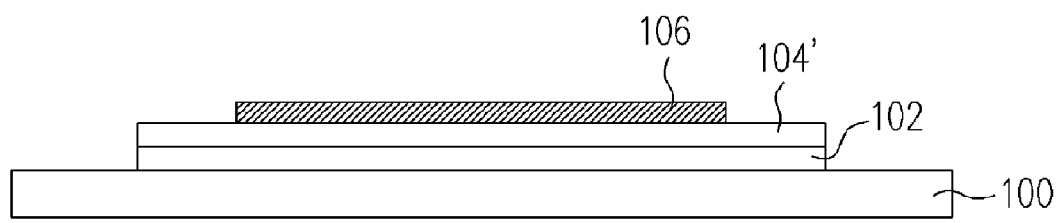
Figure 6:
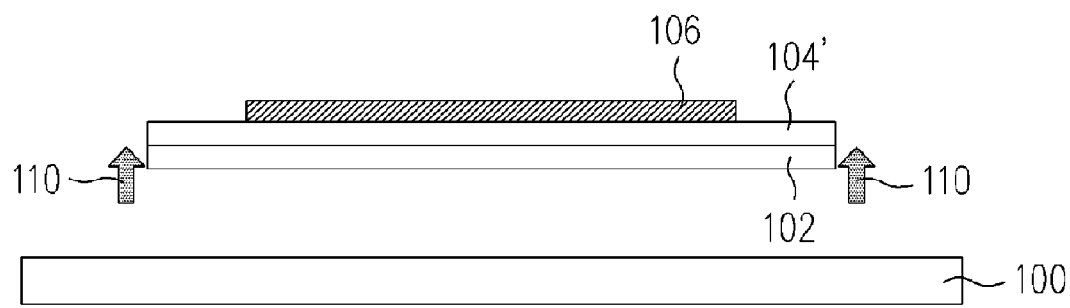

After the fabrication of the thin film transistor array 106 is completed, in the next step, the polymer material layer 104 having the thin film transistor array 106 disposed thereon is separated from the rigid substrate 100. The method for separating the polymer material layer 104 from the rigid substrate 100 is as shown in FIGS. 4~6. Referring to FIG. 4, first the insulating layer 104 disposed on at least one side of the polymer material layer 102 is removed. For example, the insulating layer 104 disposed on the position marked by the arrow 108 in FIG. 4 is removed. Afterwards, the sides of the polymer material layer 102 are exposed by the non-removed insulating layer 104' as shown in FIG. 5. Here, the insulating layer 104 that is disposed on one, two or more sides of the polymer material layer 102 may be removed as long as at least one side of the polymer material layer 102 can be exposed. In an embodiment of the present invention, the method for removing the insulating layer 104 disposed on the side surfaces of the polymer material layer 102 comprises an incising method.

After at least one side surface of the polymer material layer 102 is exposed, the interface between the polymer material layer 102 and the rigid substrate 100 is contacted with a release agent. For example, the structure shown in FIG. 5 is dipped in the release agent or is sprayed or coated with the release agent. In an embodiment of the present invention, the release agent mentioned above may be water. Here, the release agent enters the interface between the polymer material layer 102 and the rigid substrate 100 through the exposed side of the polymer material layer 102. Accordingly, the polymer material layer 102 having the thin film transistor array 106 disposed thereon can be easily separated from the rigid substrate 100 as indicated by the arrow 110 in FIG. 6.

Finally, the polymer material layer 102 having the thin film transistor array 106 (and other films such as alignment layer) disposed thereon and separated from the rigid substrate 100 becomes a flexible thin film transistor array substrate, which can be further assembled with another substrate (e.g. a color filter substrate) to form a LCD panel. Alternatively, after performing the packing and capping process, the polymer material layer 102 having the thin film transistor array 106 (and other films such as organic emitting layer and electrode layer) disposed thereon may form an Organic Electroluminescent Flat-Panel.

In the method of fabricating the flexible thin film transistor array substrate provided by the present invention, the polymer material layer is covered with an insulating layer formed by the spin coating process. Accordingly, the water, solvent, or laser heat energy that can damage the polymer material layer in the subsequent fabricating process of the thin film transistor is effectively blocked by the insulating layer. In addition, the adhesive is not used between the polymer material layer and the rigid substrate in the present invention. Thus, the polymer material layer can be easily separated from the rigid substrate in the subsequent process by simply removing a part of the insulating layer and using some release agent. Accordingly, the method of the present invention can resolve the problem that the flexible thin film transistor array substrate cannot be easily separated from a glass substrate in the prior art. In addition, the problem that the polymer material is vulnerable to acid, alkali or organic solvent is also settled.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A method of fabricating a flexible thin film transistor array substrate, comprising:
    providing a rigid substrate;
    coating a polymer material layer on the rigid substrate;
    coating an insulating layer on the polymer material layer by a spin coating process, the insulating layer covering the sides of the polymer material layer;
    forming a thin film transistor array on the insulating layer; and
    separating the polymer material layer having the thin film transistor array disposed thereon from the rigid substrate.

2. The method of fabricating the flexible thin film transistor array substrate of claim 1, wherein the polymer material layer comprises a transparent polymer material.

3. The method of fabricating the flexible thin film transistor array substrate of claim 1, wherein a temperature in a baking process of the spin coating process is within a glass transformation temperature ($T_g$) range of the polymer material layer.

4. The method of fabricating the flexible thin film transistor array substrate of claim 1, wherein the material of the insulating layer comprises an inorganic insulating material.

5. The method of fabricating the flexible thin film transistor array substrate of claim 1, wherein the material of the insulating layer comprises a water-resistance organic insulating material.

6. The method of fabricating the flexible thin film transistor array substrate of claim 1, wherein the method for separating the polymer material layer having the thin film transistor array disposed thereon from the rigid substrate comprises:
    removing the insulating layer disposed on at least one side of the polymer material layer; and
    bringing an interface between the polymer material layer and the rigid substrate in contact with a release agent.

7. The method of fabricating the flexible thin film transistor array substrate of claim 1, wherein the thin film transistor array comprises a Low Temperature Polycrystalline Thin Film Transistor (LTPS TFT) array.

8. The method of fabricating the flexible thin film transistor array substrate of claim 1, wherein the rigid substrate comprises a glass substrate.

9. The method of fabricating the flexible thin film transistor array substrate of claim 2, wherein the polymer material layer comprises a material vulnerable to acid, alkali or organic solvent.

10. The method of fabricating the flexible thin film transistor array substrate of claim 3, wherein the temperature in the baking process is lower than 200° C.

11. The method of fabricating the flexible thin film transistor array substrate of claim 4, wherein the material of the inorganic insulating layer comprises silicon oxide, silicon nitride, or silicon oxynitride.

12. The method of fabricating the flexible thin film transistor array substrate of claim 6, wherein the release agent comprises water.

13. The method of fabricating the flexible thin film transistor array substrate of claim 6, wherein the method for removing the insulating layer disposed on the side of the polymer material layer comprises an incising method.

* * * * *